US010229879B2

United States Patent
Fischer et al.

(10) Patent No.: US 10,229,879 B2
(45) Date of Patent: Mar. 12, 2019

(54) THICKENED STRESS RELIEF AND POWER DISTRIBUTION LAYER

(71) Applicant: Intel Corporation, Santa Clara, CA (US)

(72) Inventors: Kevin J. Fischer, Hillsboro, OR (US); Christopher M. Pelto, Beaverton, OR (US); Andrew W. Yeoh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/274,175

(22) Filed: Sep. 23, 2016

(65) Prior Publication Data

US 2017/0011997 A1    Jan. 12, 2017

Related U.S. Application Data

(63) Continuation of application No. 14/137,487, filed on Dec. 20, 2013, now Pat. No. 9,496,173.

(51) Int. Cl.
*H01L 21/768* (2006.01)
*H01L 23/522* (2006.01)
*H01L 23/532* (2006.01)
*H01L 23/528* (2006.01)

(52) U.S. Cl.
CPC .... *H01L 23/5283* (2013.01); *H01L 21/76852* (2013.01); *H01L 21/76879* (2013.01); *H01L 21/76885* (2013.01); *H01L 23/522* (2013.01); *H01L 23/5226* (2013.01); *H01L 23/5286* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 9,496,173 B2* | 11/2016 | Fischer | ............... H01L 23/5226 |
| 2004/0224536 A1* | 11/2004 | Sriram | ............... H01L 21/02126 |
| | | | 438/781 |
| 2004/0251549 A1 | 12/2004 | Huang | |

(Continued)

OTHER PUBLICATIONS

Prof. Krishna Saraswat, "Low-k Dielectrics", Department of Electrical Engineering, Stanford University, saraswat@stanford.edu.

(Continued)

*Primary Examiner* — Charles D Garber
*Assistant Examiner* — Xiaoming Liu
(74) *Attorney, Agent, or Firm* — Trop, Pruner & Hu, P.C.

(57) ABSTRACT

An embodiment includes a semiconductor structure comprising: a frontend portion including a device layer; a backend portion including a bottom metal layer, a top metal layer, and intermediate metal layers between the bottom and top metal layers; wherein (a) the top metal layer includes a first thickness that is orthogonal to the horizontal plane in which the top metal layer lies, the bottom metal layer includes a second thickness; and the intermediate metal layers includes a third thickness; and (b) the first thickness is greater than or equal to a sum of the second and third thicknesses. Other embodiments are described herein.

18 Claims, 2 Drawing Sheets

(56) References Cited

U.S. PATENT DOCUMENTS

| | | | |
|---|---|---|---|
| 2005/0161825 A1* | 7/2005 | Watanabe | H01L 21/76805 257/758 |
| 2006/0073695 A1 | 4/2006 | Filippi | |
| 2007/0186849 A1 | 8/2007 | Furuya | |
| 2010/0020505 A1* | 1/2010 | Brodsky | H05K 1/144 361/721 |
| 2010/0174377 A1* | 7/2010 | Heuer | A61F 2/0077 623/20.14 |
| 2010/0246152 A1* | 9/2010 | Lin | H01L 21/563 361/783 |

OTHER PUBLICATIONS

"Semiconductor device fabrication", http://www.fact-index.com/s/se/semiconductor_device_fabrication.html.

Taiwan Intellectual Property Office, Office Action dated Jun. 23, 2016 in Taiwan Patent Application No. 103139910.

Edited by Jiri Nemecek, "Nanoindentation in Materials Science", Oct. 17, 2012. Chapter 10 :Mechanical characterization of Black Diamond (Low-k) Structures for 30 Integrated Circuit and Packaging Applications, p. 233-236.

Taiwan Intellectual Property Office, Office Action dated Mar. 8, 2017 in Taiwan Patent Application No. 105131061.

* cited by examiner

THICKENED STRESS RELIEF AND POWER DISTRIBUTION LAYER

CROSS REFERENCE

This application is a continuation of U.S. patent application Ser. No. 14/137,487, filed Dec. 20, 2013 entitled "Thickened Stress Relief and Power Distribution Layer." The content of the above application is hereby incorporated by reference.

TECHNICAL FIELD

An embodiment addresses stress relief and/or power distribution in semiconductor manufacturing.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front End Processing refers to the initial steps in the fabrication. In this stage the actual semiconductor devices (e.g., transistors) are created. A typical front end (also referred to herein as "frontend") process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" of the back end (also referred to herein as "backend") involves depositing various layers of metal and insulating material in the desired pattern. Typically the metal layers consist of aluminum, copper, and the like. The insulating material may include $SiO_2$, low-K materials, and the like. The various metal layers are interconnected by etching holes, called "vias", in the insulating material and depositing metal (e.g., Tungsten) in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
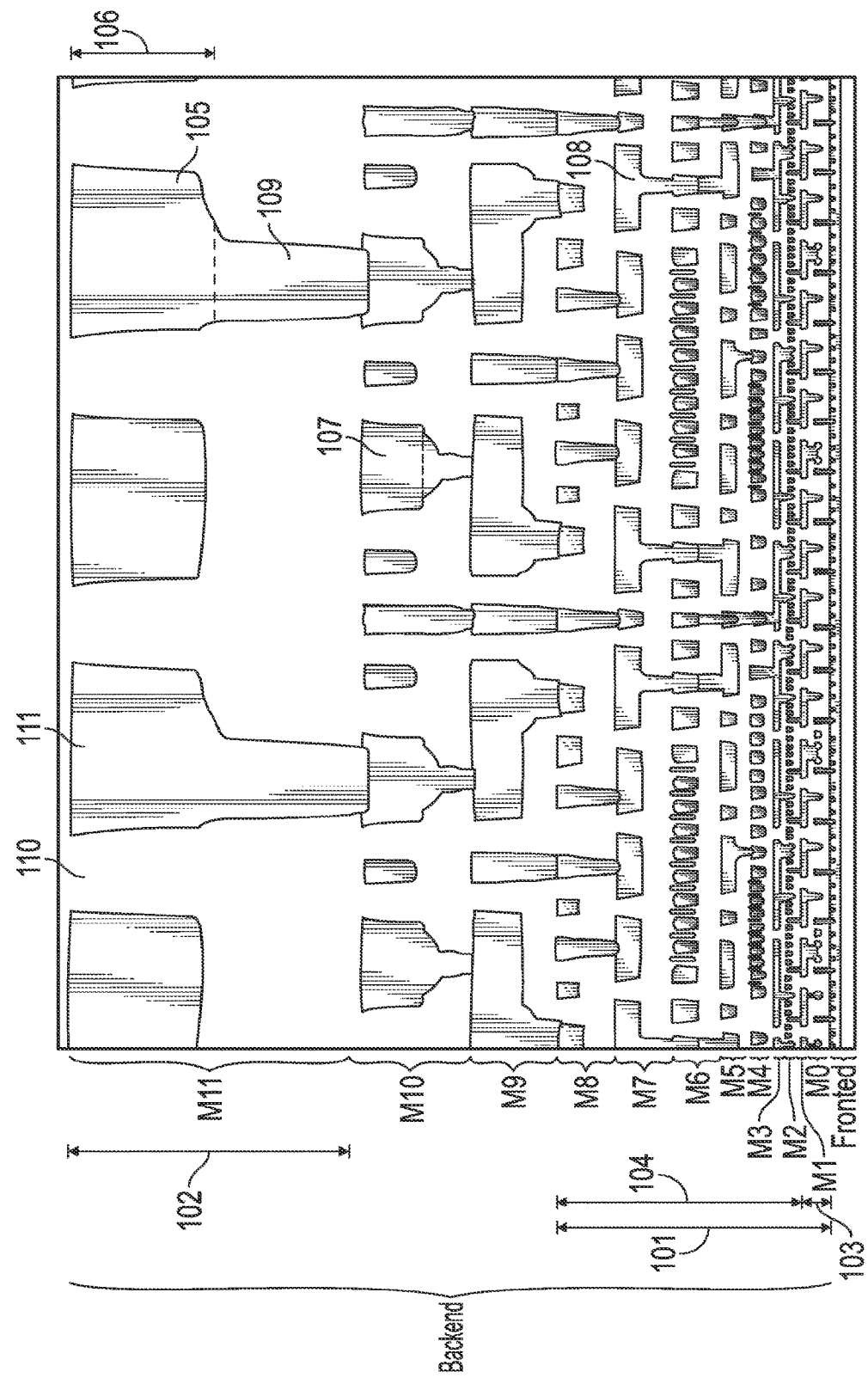
FIG. 1 includes a scanning electron microscope (SEM) image of an embodiment of the invention.

Reference will now be made to the drawings wherein like structures may be provided with like suffix reference designations. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

More and more interconnect metal layers of the backend are being processed with dielectric materials (dielectrics) having low-k properties. This is the case because low-k dielectrics are thin, which is critical as feature size falls and the scaling of interconnects must keep pace with the falling feature size. Also, low-k dielectrics are needed because the smaller form factor devices also demand ever lower capacitive coupling between adjacent lines of the devices to achieve sufficient resistive-capacitive (RC) delay performance in the interconnect systems of the devices.

The increasing use of low-k dielectrics is problematic because integrating low k materials (or lower k materials) into metal layers within the interconnect stack of the backend makes those layers prone to delamination failure modes. The delamination results from insufficient strength of the dielectric layers to withstand the stresses of flip chip packaging process (e.g., C4 bump) common to the microprocessor industry. Also, packaging causes high peeling stresses on the silicon die backend dielectric layers as a result of mismatched coefficients of thermal expansion (CTE) between the die and package after the package has been attached at high temperature and returned to equilibrium at room temperature.

Known solutions to address stress reduction in the lower layers of the interconnect stack involve means to reduce stress in the low-k dielectric layers that require an overall penalty to the performance of the microprocessor. For example, methods which require strengthening the dielectric material used in the interconnect stack often deteriorate capacitance performance, which results in an undesirably use of power. Alternate methods to decrease packaging stresses may require increasing the pitch of the bumps in the die/package interface, which degrades power delivery by sacrificing first layer interconnect (FLI) density, or modifying the bump metallurgy which can complicate package process integration and reliability of the package interconnect.

An embodiment of the invention addresses the above problems. The embodiment includes a thick top metal interconnect layer. This thickened metal layer or layers enables integration of lower-k materials layers within the backend interconnect stack that would otherwise be at risk for delamination failure. The thick top interconnect layer serves as a stress attenuating layer when placed in the stack between the more fragile low-k dielectric layers and the package, thereby imparting lower stresses on the critical layers to levels below their respective failure thresholds. Inclusion of this stress reducing thick top layer provides the means to include more interconnect layers processed with low-k properties, which is increasingly critical as feature size and, correspondingly, interconnects shrink.

An embodiment including a thick interconnect layer at the top of the die's metal stack has an added benefit in that it also provides an excellent low resistance layer for effective power bussing across the die, which can be leveraged for novel circuit architecture implementations.

An embodiment also addresses the problems caused by the CTE differences described above. A very thick layer at the top of the backend stack can provide significant reduction in the stress levels that are ultimately transmitted into the layers below the thick top layer by increasing the relative distance of the weaker layers from the package (which is on the thick top layer). In an embodiment this effect is even more pronounced because the thick layer is processed with a higher modulus of elasticity (modulus) dielectric that further enhances the stress attenuation effect.

An embodiment having a thickened top metal layer also includes improved power distribution across the die, which is achieved by the inherent benefit of deeper and wider trenches that are patterned into the thickened top layer to form the interconnect lines. An embodiment includes filling the trenches with copper metallization in a dual damascene implementation. The interconnect lines thus have a larger cross sectional area that provides a concomitant reduction in the resistive voltage drop for a given distance when compared to the metal line patterned into a thinner layer that must run over the same distance.

An embodiment includes a topmost layer that utilizes a relatively large pitch with a deep trench and tall via when compared to underlying layers. This provides a low resistance drop on the power grid and maximizes the stress attenuation effect. In an embodiment the entire thickness of this top layer, which includes the via, is made with a very high modulus dielectric material by a dual damascene process.

While in conventional devices a low-k dielectric is desired to prevent signal interference, in an embodiment a higher-k dielectric (e.g., $SiO_2$) is tolerable because the function of the thickened layer is mechanical strength—not signal preservation. Since the layer is used exclusively (or almost exclusively) for power distribution, any sacrifice in capacitance performance due to the use of a high-k dielectric can be recovered by adjusting the line/interconnect separation accordingly.

Thus, an embodiment (a) provides a rigid stress protection layer, and/or (b) provides a low voltage drop (IR drop) power distribution layer. Such an embodiment enables the use of lower k dielectrics, which typically have a considerably lower modulus and are thus more susceptible to failure from packaging stresses when integrated into a metal stack. Embodiments further provide better layout density and die scaling. The availability of a low resistive interconnect layer allows relaxation (increase) of bump pitch for power distribution (i.e., with less voltage drop there is less need to increase the number of bumps for power supply, which results in better layout density). Low resistance interconnects can therefore by applied in novel architectures such as leadway routing that, for example, can increase the usable silicon area in areas surrounding high bump usage areas like I/Os.

Looser bump pitch can reduce packaging cost and improve package yield (i.e., bumps are not so close that shorts and the like are caused) without sacrificing power delivery for the microprocessor. Looser bump pitch enables lower cost packages since package traces can be patterned between bump openings on the top packaging layer with less advanced techniques, rather than having to add additional layers into the package for routing or moving to more advanced and expensive patterning technology that can handle the reduced dimensions.

FIG. 1 includes a scanning electron microscope (SEM) image of an embodiment of the invention. A frontend portion includes a device layer on a substrate. The device layer may include transistors and the like. A backend portion includes 12 metal layers (M0, M1, M2, M3, M4, M5, M6, M7, M8, M9, M10, and M11). This is just an example and other embodiments may include more (e.g., 14, 16, 18, 20 or more) or less (e.g., 4, 6, 8) metal layers. The particular embodiment of FIG. 1 includes a bottom metal layer (M0), a top metal layer (M11), and a plurality of metal layers (M1, M2, M3, M4, M5, M6, M7, M8, M9, and/or M10) between the bottom and top metal layers. The "bottom metal layer" is so named because the backend portion includes no metal layer between the bottom metal layer and a top of the frontend portion. The "top metal layer" is so named because the backend portion includes no metal layer between the top metal layer and the top of the backend portion.

In an embodiment the top metal layer M11 includes a top metal layer thickness 102 extending from a bottom of the top metal layer to a top of the top metal layer. The bottom metal layer M0 includes a bottom metal layer thickness 103 extending from a bottom of the bottom metal layer to a top of the bottom metal layer. Also, a plurality of the metal layers includes a multilayer thickness extending from a bottom of the plurality of metal layers to a top of the plurality of metal layers. Thus, in this particular example top metal layer thickness 102 is greater than or equal to a sum of the bottom metal layer thickness 103 and the multilayer thickness 104. This summed thickness is noted as distance 101. In an embodiment thickness 102 is at least 1.75 microns, however in other embodiments thickness 102 may be 1.5, 1.6, 1.8, 1.9, 2.0, 2.1, 2.2, 2.3, 2.4 or more microns thick. This specific thickness range is important in determining strength and voltage drop for a semiconductor device.

Of course, in other embodiments distance 104 could also be measured from the bottom of M1 to the top of M2, M3, M4, M5, M6, or M7. In each of these cases the summed distance 101 would still be no greater than distance 102. In other embodiments the thick oxide top layer M11 may be nearly the same thickness of the other 10 M layers between frontend and M11. In the case of FIG. 1, the "plurality of metal layers" includes at least 5 metal layers (e.g., M1, M2, M3, M4, M5) with no other metal layers located between any 2 of the at least 5 metal layers. In fact, it would also be accurate to say in FIG. 1 the "plurality of metal layers" includes at least 8 metal layers (e.g., M1, M2, M3, M4, M5, M6, M7, M8) with no other metal layers located between any 2 of the at least 8 metal layers.

In FIG. 1 the backend portion includes an additional metal layer M10 immediately below and adjacent the top metal layer M11. The additional metal layer M10 includes an additional metal layer resistivity (Ohm/μm) and the top metal layer M11 includes a top metal layer resistivity that is less than 10% of the additional metal layer resistivity. As explained above, the top metal layer has a low voltage drop and lessened resistivity. In other embodiments the top metal layer M11 includes a top metal layer resistivity that is less than 5, 15, 25, 35, 45, 55% of the additional metal layer resistivity. The term Ohms-μm ("ohms micron") refers to the measurement of the "volume" resistivity (also known as "bulk" resistivity) of a semiconductive material. The value in Ohms-μm is the inherent resistance of a given material regardless of the shape or size.

In FIG. 1 the top metal layer M11 includes a trench 105 with a cross-sectional area (taken by multiplying height 106 by a width that is not shown and would be measured "going into" the 2 dimensional FIG. 1) greater than any trench included in any one of the plurality of metal layers (such as trench 107 or trench 108). Obviously cross-sectional area is not to be taken using a width of an interconnect line wherein the width could vary depending on how long the interconnect runs in a horizontal direction. In other words, the dominant factor in the cross-sectional area calculation is the depth of the trench taken from above a via to the top of the interconnect. In fact, none of layers M0-M10 include a trench with a greater cross-sectional area than trench 105.

In an embodiment, the metal patterning of M11 may be performed with a "dual-Damascene" process whereby the underlying silicon oxide insulating layer is patterned with open trenches where the conductor should be. A thick coating of copper that significantly overfills the trenches is deposited on the insulator, and chemical-mechanical planarization (CMP) is used to remove the copper (known as overburden) that extends above the top of the insulating layer. Copper sunken within the trenches of the insulating layer is not removed and becomes the patterned conductor (e.g., interconnect). Dual-Damascene processes generally form and fill two features with copper at once (e.g., trench 105 overlying via 109 may both be filled with a single copper deposition using dual-Damascene processing).

In an embodiment, the backend portion is coupled to a plurality of contact bumps (not shown in FIG. 1), such as Controlled Collapse Chip Connection ('C4') bumps.

In an embodiment each of metal layers M0-M10 includes a dielectric material that has a lower dielectric constant (k) value than a dielectric included in the top metal layer M11. Thus, M11 may have a dielectric with k=4.0, M2 may have a dielectric with k=2.8, and M5 may have a dielectric with k=3.2.

The k value is a physical measure of the electric polarizability of a material. Polarizability is the tendency of a material to allow an externally applied electric field to induce electric dipoles (separated positive and negative charges) in the material. A low-k dielectric is a material with a small dielectric constant relative to $SiO_2$ (having k=3.9).

In an embodiment any of layers M0-M10 may include $SiO_2$ doped with fluorine to produce fluorinated silica glass with a k value around 3.5. In an embodiment any of layers M0-M10 may include $SiO_2$ doped with carbon to yield a material with a k value of 2.5, 2.8, 3.0. In an embodiment various methods may be employed to create large voids or pores in a $SiO_2$ dielectric. Voids can have a k value of nearly 1, thus the k value of the porous material may be reduced by increasing the porosity of the film. Thus, in an embodiment any of layers M0-M10 may include highly porous $SiO_2$ with a k value at or lower than 2. In an embodiment, the k value for any of layers M0-M10 may be no greater than 3.6 (e.g., $SiO_2$ doped with fluorine k=3.5, $SiO_2$ doped with carbon k=2.5, 2.8, or 3.0, porous $SiO_2$ k=2.0) and the dielectric material for M11 may be no less than 3.8 (e.g., $SiO_2$ has k=3.9-4.0). In an embodiment the M11 dielectric is $SiO_2$ and any of M0-M10 layers may include a dielectric having any of the following: SiOC(H) (k=2.8), F-doped oxide (CVD) (k=3.3-3.9), C-doped oxide (k=2.8-3.5), H-doped oxide (k=2.5-3.3), polyimide (spin-on) (k=3.0-4.0), aromatic polymer (spin-on) (k=2.6-3.2), vapor-deposited parylene or parylene-F (k~2.7 or k~2.3 respectively), F-doped amorphous carbon (k=2.3-2.8), Teflon/PTFE (spin-on) (k=1.9-2.1), xerogels/aerogels (k=1.8-2.5), and air (k=1).

In an embodiment the M11 dielectric has a modulus that is higher than a modulus for the dielectric for any of M0-M10. In an embodiment each of M1, M2, M3, M4, M5, M6, M7, M8, M9, and/or M10 includes a coefficient of thermal expansion unequal to the top metal layer.

As mentioned above, M11 is the top metal layer in the example of FIG. 1. However, that is not implying that M11 is the top layer in general or that there is no metal above M11. Instead, M11 is a "top metal layer" in that it is topmost of not all layers or any layer with metal but of the "metal layers" as those of ordinary skill in the art would construe that term. In other words, once the semiconductor devices have been created, they must be interconnected to form the electrical circuits. This occurs in a series of wafer processing steps collectively referred to as Back-end-of-line (BEOL) (not to be confused with back end of chip fabrication, which refers to the packaging and testing stages). BEOL processing involves creating metal interconnecting wires that are isolated by dielectric layers. These backend layers including metal interconnecting wires that are isolated by dielectric material are "metal layers". In other words, the "top metal layer" in the context addressed herein is a top interconnect metal layer that includes dielectric material. The top metal layer may include a top damascene formed interconnect layer that includes dielectric material. This top metal layer is formed using an interconnect formation process performed in a semiconductor fabrication (FAB) facility. Layers above this "top metal layer" are classified as part of BEOL wiring layers (e.g., typified by layers supported at outsourced assembly and test (OSAT) houses, not FABs).

Figure 2:
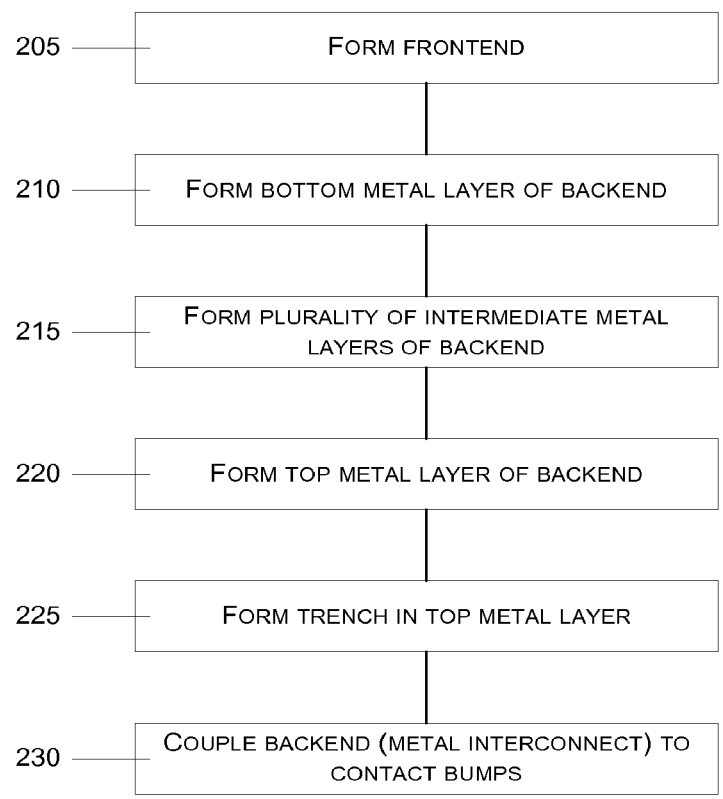
FIG. 2 includes a process in an embodiment of the invention.

FIG. 2 includes a process in an embodiment of the invention. Block 205 includes forming a frontend portion. The frontend portion may include a device layer on a substrate. Block 210 includes forming a bottom metal layer (of the backend) on the front portion. Block 215 includes forming a plurality of intermediate metal layers on the bottom metal layer. Block 220 includes forming a top metal layer on the plurality of intermediate metal layers.

In an embodiment the top metal layer includes a top metal layer thickness extending from a bottom of the top metal layer to a top of the top metal layer; the bottom metal layer includes a bottom metal layer thickness extending from a bottom of the bottom metal layer to a top of the bottom metal layer; the plurality of metal layers includes a multilayer thickness extending from a bottom of the plurality of metal layers to a top of the plurality of metal layers; and the top metal layer thickness is greater than or equal to a sum of the bottom metal layer thickness and the multilayer thickness.

Block 225 includes forming a trench in the top metal layer, wherein the trench has a cross-sectional area greater than every trench included in the plurality of metal layers based on the trench having a larger depth than every trench included in the plurality of metal layers. Block 230 includes coupling the backend portion to a plurality of contact bumps.

Example 1 includes a semiconductor structure comprising: a frontend portion including a device layer on a substrate; a backend portion including a bottom metal layer, a top metal layer, and a plurality of metal layers between the bottom and top metal layers; wherein (a) the backend portion includes no metal layer between the bottom metal layer and a top of the frontend portion; (b) the backend portion includes no metal layer between the top metal layer and the top of the backend portion; (c) the top metal layer includes a top metal layer thickness extending from a bottom of the top metal layer to a top of the top metal layer; (d) the bottom metal layer includes a bottom metal layer thickness extending from a bottom of the bottom metal layer to a top of the bottom metal layer; (e) the plurality of metal layers includes a multilayer thickness extending from a bottom of the plurality of metal layers to a top of the plurality of metal layers; and (f) the top metal layer thickness is greater than or equal to a sum of the bottom metal layer thickness and the multilayer thickness.

In example 2 the subject matter of the Example 1 can optionally include wherein the plurality of metal layers includes at least 7 metal layers.

In example 3 the subject matter of the Examples 1-2 can optionally include wherein (a) the backend portion includes an additional metal layer immediately below and adjacent the top metal layer, (b) the additional metal layer includes an additional metal layer resistivity and the top metal layer includes a top metal layer resistivity that is less than 10% of the additional metal layer resistivity.

In example 4 the subject matter of the Examples 1-3 can optionally include wherein the top metal layer includes a trench with a cross-sectional area greater than every trench included in the plurality of metal layers based on the trench having a larger depth than every trench included in the plurality of metal layers.

In example 5 the subject matter of the Examples 1-4 can optionally include wherein the backend portion is coupled to a plurality of contact bumps.

In example 6 the subject matter of the Examples 1-5 can optionally include wherein each of the plurality of metal layers includes a first dielectric material that has a lower dielectric constant (k) value than a second dielectric included in the top metal layer.

In example 7 the subject matter of the Examples 1-6 can optionally include wherein the first dielectric material has a lower modulus of elasticity than the second dielectric material.

In example 8 the subject matter of the Examples 1-7 can optionally include wherein each of the plurality of metal layers includes a coefficient of thermal expansion unequal to the top metal layer.

In example 9 the subject matter of the Examples 1-8 can optionally include wherein the first dielectric material includes a k value no greater than 3.6 and the second dielectric material includes a k value no less than 3.8.

In example 10 the subject matter of the Examples 1-9 can optionally include wherein the second dielectric material includes SiO2 and the first dielectric material includes a carbon doped oxide (CDO).

In example 11 the subject matter of the Examples 1-10 can optionally include wherein the top metal layer includes power distribution interconnects but no signal interconnects.

In example 12 the subject matter of the Examples 1-11 can optionally include wherein the top metal layer includes a dielectric and is the topmost interconnect layer in the apparatus.

In example 13 the subject matter of the Examples 1-12 can optionally include wherein the top metal layer thickness is at least 1.75 microns.

In example 14 the subject matter of the Examples 1-13 can optionally include wherein the plurality of metal layers includes at least 9 metal layers.

Example 15 includes a method comprising: forming a frontend portion, including a device layer, on a substrate; forming a bottom metal layer on the frontend portion; forming a plurality of metal layers on the bottom metal layer; and forming a top metal layer on the plurality of metal layers; wherein (a) a backend portion, including the top and bottom metal layers and the plurality of metal layers, includes no metal layer between the bottom metal layer and a top of the frontend portion; (b) the backend portion includes no metal layer between the top metal layer and the top of the backend portion; (c) the top metal layer includes a top metal layer thickness extending from a bottom of the top metal layer to a top of the top metal layer; (d) the bottom metal layer includes a bottom metal layer thickness extending from a bottom of the bottom metal layer to a top of the bottom metal layer; (e) the plurality of metal layers includes a multilayer thickness extending from a bottom of the plurality of metal layers to a top of the plurality of metal layers; and (f) the top metal layer thickness is greater than or equal to a sum of the bottom metal layer thickness and the multilayer thickness.

In example 16 the subject matter of the Example 15 can optionally include wherein the plurality of metal layers includes at least 7 metal layers.

In example 17 the subject matter of the Examples 15-16 can optionally include forming a trench in the top metal layer, wherein the trench has a cross-sectional area greater than every trench included in the plurality of metal layers based on the trench having a larger depth than every trench included in the plurality of metal layers.

In example 18 the subject matter of the Examples 15-17 can optionally include coupling the backend portion to a plurality of contact bumps.

In example 19 the subject matter of the Examples 15-18 can optionally include wherein each of the plurality of metal layers includes a dielectric material that has a lower dielectric constant (k) value than a second dielectric included in the top metal layer.

Example 20 includes a semiconductor structure comprising: a frontend portion including a device layer; a backend portion including a bottom metal layer, a top metal layer, and intermediate metal layers between the bottom and top metal layers; wherein (a) the top metal layer includes a first thickness that is orthogonal to the horizontal plane in which the top metal layer lies, the bottom metal layer includes a second thickness; and the intermediate metal layers includes a third thickness; and (b) the first thickness is greater than or equal to a sum of the second and third thicknesses.

In example 21 the subject matter of the Example 20 can optionally include wherein the plurality of metal layers includes between 5 and 20 metal layers.

In example 22 the subject matter of the Examples 20-21 can optionally include wherein at least one of the intermediate metal layers includes a first dielectric material that has a lower dielectric constant (k) value than a second dielectric included in the top metal layer.

In example 23 the subject matter of the Examples 20-22 can optionally include wherein the first dielectric material has a lower modulus of elasticity than the second dielectric material.

In example 24 the subject matter of the Examples 20-23 can optionally include wherein the first dielectric material includes a k value no greater than 3.3 and the second dielectric material includes a k value no less than 3.6.

In example 25 the subject matter of the Examples 20-24 can optionally include wherein the top metal layer includes power distribution interconnects but no signal interconnects.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A semiconductor structure comprising:
   a device layer including a transistor and a contact coupled to a node of the transistor;
   a backend metallization stack, on the device layer, including a plurality of metal layers comprising: a first metal layer (M1), a second metal layer (M2), a third metal layer (M3), a fourth metal layer (M4), a fifth metal layer (M5), a sixth metal layer (M6), a seventh metal layer (M7), an eighth metal layer (M8), a ninth metal layer (M9), and a tenth metal layer (M10);
   wherein (a)(i) the M1 layer is on the device layer, (a)(ii) the M2, M3, M4, M5 M6, M7, M8 and M9 layers are between the M1 and M10 layers, and (a)(iii) the M9 layer is immediately below and adjacent the M10 layer with no other metal layer between the M9 and M10 layers;
   wherein: (b)(i) the M10 layer includes an interlayer dielectric (ILD) portion that includes silicon oxide; and (b)(ii) the M9 layer includes an ILD portion doped with carbon;
   wherein: (c)(i) each of the plurality of metal layers includes a trench, a via, and a height measured from a top of the trench to a bottom of the via, and (c)(ii) the height of the M10 layer is greater than a sum of the heights of the M1, M2, M3, M4, M5 M6, M7, M8 and M9 layers;
   wherein: (d)(i) the M10 layer includes a dual damascene interconnect that includes copper and the trench and the via of the M10 layer, and (d)(ii) the trench and the via of the M10 layer together form a single, materially continuous structure with copper extending uninterrupted from the trench of the M10 layer to the via of the M10 layer;
   wherein the trench of each of the plurality of metal layers includes a height and the height of the trench of the M10 layer is greater than a sum of the heights of the trenches of the M1, M2, M3, M4, M5 M6, M7, M8 and M9 layers;
   wherein the trench of the M10 layer has a cross-sectional area greater than a cross-sectional area of each of the trenches of the M1, M2, M3, M4, M5 M6, M7, M8 and M9 layers.

2. The semiconductor structure of claim 1, wherein each of the M1, M2, M3, M4, M5 M6, M7, M8 and M9 layers includes an interconnect that includes copper.

3. The semiconductor structure of claim 1, wherein the M9 layer includes an additional ILD portion comprising silicon oxide.

4. The semiconductor structure of claim 3, wherein at least four of the M1, M2, M3, M4, M5 M6, M7, and M8 layers include an ILD portion doped with carbon.

5. The semiconductor structure of claim 3, wherein at least four of the M1, M2, M3, M4, M5 M6, M7, and M8 layers include a dielectric material that has a lower dielectric constant (k) value than silicon oxide.

6. The semiconductor structure of claim 3, wherein at least four of the M1, M2, M3, M4, M5 M6, M7, and M8 layers include a dielectric material with a k value no greater than 3.6.

7. The semiconductor structure of claim 1, wherein the backend metallization stack includes an eleventh metal layer (M11).

8. The semiconductor structure of claim 7, wherein the M11 layer is between the M1 and M10 layers.

9. The semiconductor structure of claim 1, wherein the backend metallization stack is coupled to a plurality of contact bumps.

10. The semiconductor structure of claim 1, wherein the height of the M10 layer is at least 1.5 microns.

11. The semiconductor structure of claim 4, wherein the M10 layer includes a total number of interconnects a majority of which are power distribution interconnects and not signal interconnects.

12. The semiconductor structure of claim 11, wherein at least four of the M1, M2, M3, M4, M5 M6, M7, and M8 layers include signal interconnects.

13. The semiconductor structure of claim 1, wherein no portion of the M9 layer extends above any portion of the M10 layer.

14. The semiconductor structure of claim 1, wherein in a vertical cross-section of the semiconductor structure:
   no majority of cross-sectional area of the M1 layer overlaps vertically any majority of cross-sectional area of any of the M2, M3, M4, M5 M6, M7, M8, M9, and M10 layers;
   no majority of cross-sectional area of the M2 layer overlaps vertically any majority of cross-sectional area of any of the M1, M3, M4, M5 M6, M7, M8, M9, and M10 layers;
   no majority of cross-sectional area of the M3 layer overlaps vertically any majority of cross-sectional area of any of the M1, M2, M4, M5 M6, M7, M8, M9, and M10 layers;
   no majority of cross-sectional area of the M4 layer overlaps vertically any majority of cross-sectional area of any of the M1, M2, M3, M5 M6, M7, M8, M9, and M10 layers;
   no majority of cross-sectional area of the M5 layer overlaps vertically any majority of cross-sectional area of any of the M1, M2, M3, M4, M6, M7, M8, M9, and M10 layers;
   no majority of cross-sectional area of the M6 layer overlaps vertically any majority of cross-sectional area of any of the M1, M2, M3, M4, M5, M7, M8, M9, and M10 layers;
   no majority of cross-sectional area of the M7 layer overlaps vertically any majority of cross-sectional area of any of the M1, M2, M3, M4, M5, M6, M8, M9, and M10 layers;
   no majority of cross-sectional area of the M8 layer overlaps vertically any majority of cross-sectional area of any of the M1, M2, M3, M4, M5, M6, M7, M9, and M10 layers;

no majority of cross-sectional area of the M9 layer overlaps vertically any majority of cross-sectional area of any of the M1, M2, M3, M4, M5, M6, M7, M8, and M10 layers;

no majority of cross-sectional area of the M10 layer overlaps vertically any majority of cross-sectional area of any of the M1, M2, M3, M4, M5 M6, M7, M8, and M9 layers; and the height of M10 layer is measured vertically.

15. The semiconductor structure of claim 11, wherein:
the trench of the M10 layer has a width and length;
the width and the length are both orthogonal to the height;
the length is greater than the width;
the cross-sectional area of the trench of the M10 layer is based on the height and the width and is not based on the length.

16. A semiconductor structure comprising:
a device layer including a switching element and a contact coupled to a node of the switching element;
a backend metallization stack, on the device layer, including a plurality of metal layers comprising: a first metal layer (M1), a second metal layer (M2), a third metal layer (M3), a fourth metal layer (M4), a fifth metal layer (M5), a sixth metal layer (M6), a seventh metal layer (M7), an eighth metal layer (M8), and a ninth metal layer (M9);
wherein (a)(i) the M1 layer is on the device layer, (a)(ii) the M2, M3, M4, M5 M6, M7, and M8 layers are between the M1 and M9 layers, and (a)(iii) the M8 layer is immediately below and adjacent the M9 layer with no other metal layer between the M8 and M9 layers;

wherein: (b)(i) the M9 layer includes an interlayer dielectric (ILD) portion that includes silicon oxide; and (b)(ii) the M8 layer includes an ILD portion doped with carbon;

wherein: (c)(i) each of the plurality of metal layers includes a trench, a via, and a height measured from a top of the trench to a bottom of the via, and (c)(ii) the height of the M9 layer is greater than a sum of the heights of the M1, M2, M3, M4, M5 M6, M7, and M8 layers;

wherein: (d)(i) the M9 layer includes a dual damascene interconnect that includes copper and the trench and the via of the M9 layer, and (d)(ii) the trench and the via of the M9 layer together form a single, materially continuous structure;

wherein the trench of each of the plurality of metal layers includes a height and the height of the trench of the M9 layer is greater than a sum of the heights of the trenches of the M1, M2, M3, M4, M5 M6, M7, and M8 layers;

wherein the trench of the M9 layer has a cross-sectional area greater than a cross-sectional area of each of the trenches of the M1, M2, M3, M4, M5 M6, M7, and M8 layers.

17. The semiconductor structure of claim 16, wherein the M8 layer includes an additional ILD portion comprising silicon oxide.

18. The semiconductor structure of claim 17, wherein at least four of the M1, M2, M3, M4, M5 M6, and M7 layers include an ILD portion doped with carbon.

* * * * *